United States Patent [19]

Chapman et al.

[11] 4,360,732

[45] Nov. 23, 1982

[54] INFRARED CHARGE TRANSFER DEVICE (CTD) SYSTEM

[75] Inventors: Richard A. Chapman, Dallas; Adam J. Lewis, Jr.; Jaroslav Hynecek, both of Richardson; Michael A. Kinch, Dallas, all of Tex.

[73] Assignee: Texas Instruments Incorporated, Dallas, Tex.

[21] Appl. No.: 159,990

[22] Filed: Jun. 16, 1980

[51] Int. Cl.³ .............................................. H01J 31/49
[52] U.S. Cl. .................................. 250/332; 250/349; 357/24; 357/30; 357/32
[58] Field of Search ...................... 250/332, 330, 349; 357/24, 30, 32; 358/113

[56] References Cited

U.S. PATENT DOCUMENTS

| | | |
|---|---|---|
| 4,054,797 | 10/1977 | Milton et al. ...................... 250/332 |
| 4,061,916 | 12/1977 | King et al. ........................... 250/332 |
| 4,063,268 | 12/1977 | King ................................. 250/332 X |
| 4,079,507 | 3/1978 | King ................................. 250/332 X |
| 4,275,407 | 6/1981 | Lorenze et al. ................. 250/332 X |
| 4,286,278 | 8/1981 | Lorenze et al. ................. 250/332 X |

*Primary Examiner*—Davis L. Willis
*Attorney, Agent, or Firm*—Rene' E. Grossman; Alva H. Bandy; Melvin Sharp

[57] ABSTRACT

An infrared charge transfer device (CTD) imaging system is disclosed which includes an optic system for focusing infrared energy emanating from a scene, a detector matrix for receiving the focused infrared energy and converting it to electrical signals representative of the intensity of the infrared energy, and a video processor for processing the electrical signals into video signals. The detector matrix of the system is a plurality of IR detector cells arranged in rows and columns. Each detector cell includes a substrate of semiconductor material, an integrating electrode, a drain electrode, a transfer electrode and insulating layers. The integrating electrode is centrally disposed with respect to the drain and transfer electrodes with the integrating electrode in a spaced relationship with the drain electrode. The integrating and drain electrodes form first level MIS electrodes on the semiconductor substrate. The transfer gate forms a second level MIS electrode as to the semiconductor substrate and overlaps the space between the integrating and drain electrodes. In a second MIS embodiment the drain electrode is replaced by a diode formed in the semiconductor substrate. In both embodiments, the integrating electrodes are connected together in columns and the transfer electrodes are connected together in rows. In operation, the integrating electrode and the drain are on while a row of transfer electrodes are turned on and then off transferring the charge from wells under the integrating electrode to the drain well. The column voltages are sampled before and after the turn-on and turn-off of the integrating well the voltage difference on the column lines is proportional to the charge transferred and is used to indicate the intensity of the impinging infrared image. Charge collected by the drain is either injected to the substrate in the first embodiment or drained out the contact to the junction diode in the second embodiment.

12 Claims, 14 Drawing Figures

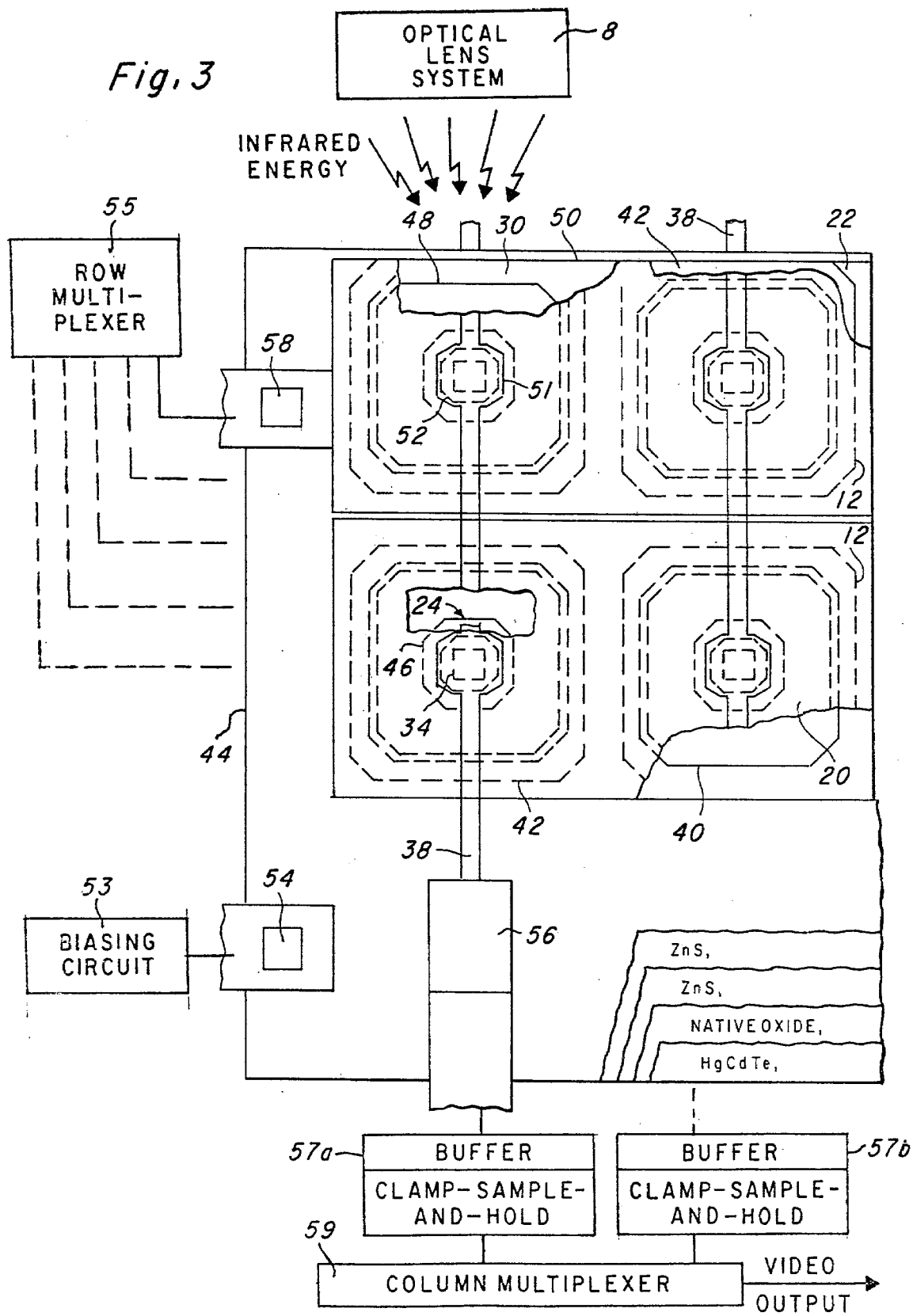

INFRARED CHARGE TRANSFER DEVICE (CTD) SYSTEM

This invention relates to infrared energy imaging systems and more particularly to a system using a charge transfer device detector matrix.

In the past, infrared energy detecting and imaging systems have included detector matrices utilizing charge transfer devices such as charge injection device (CID) detector elements. These devices utilize a row and a column electrode within a field plate/channel stop which defines each cell. The electrodes form corresponding potential wells for storing charges generated by impinging infrared energy. However, when the column wells are turned on and off by an injection pulse, dark current is generated by the electric field which forms between the edges of the field plate and column line electrode. The dark current flows into the potential wells and reduces their capacity and thus the cell efficiency. Further, CID matrices have blooming cross talk from those unaddressed cells which have high intensity pixels imaged upon them.

Accordingly, it is an object of this invention to provide an improved infrared imaging system.

Another object of the invention is to provide an infrared imaging system having an improved infrared detector matrix.

Still another object of the invention is to provide an infrared imaging system having a detector matrix with substantially reduced dark current.

Yet another object of the invention is to provide an infrared imaging system having new modes of operation.

Still yet another object of the invention is to reduce substantially the blooming cross talk between detector elements of the imager's detector matrix.

Briefly stated the invention comprises an infrared energy imaging system comprising an optic system for focusing infrared energy emanating from a scene in the field-of-view, a detector matrix for receiving the focused infrared energy and converting it to electrical signals representative of its intensity, and a video processor for processing the electrical signals into video signals. The detector matrix of the system is a plurality of IR detector cells arranged in rows and columns. The cells consist of centralized integrated/column wells in combination with transfer gates to provide novel operational modes and advantages. One advantage is that there is no instance at which a first level MIS gate (electrode) is off while an adjacent higher (second) level gate is on thereby reducing substantially the edge dark current. Another advantage is that as a common drain is used, the transfer gate structure requires only two address lines per cell. Another advantage resulting from use of a common drain is that the charge transferred from an integrate well to the drain can spread over the whole area of the drain thereby providing a more rapid dispersal of the charge. Yet another advantage is that there is no injection pulse between the clamp and sample steps on the sense line. A final advantage is that as the storage/integrate well area is much larger and on the first level with the drain, large capacity is obtained thereby increasing the signal to noise ratio of the cell.

Other objects and features of the invention will become more readily apparent from the following detailed description when read in conjunction with the accompanying drawings, in which like reference numerals designate like parts throughout the figures thereof, and in which:

FIG. 3 is a partial plan view of the detector matrix with portions broken away to show the details of the infrared energy imaging system;

The infrared energy detecting and imaging system comprises an optical lens system 8 for focusing infrared energy emanating from a scene in the field-of-view onto the infrared energy detecting matrix 10 (FIG. 3). The infrared energy detector matrix, which will be described more fully hereinafter, has a plurality of detector cells for storing charges generated by the impinging infrared energy. These charges result in voltage difference signals which are representative of the intensity of the infrared energy. The voltage difference signals are processed into video signals by a video processor not shown. Those desiring additional information concerning the optical lens system and video processor are referred to U.S. Pat. No. 3,742,238 issued June 26, 1973 to Richard G. Hoffman, II for a "Two Axis Angularly Indexing Scanning Display."

The infrared detector matrix 10 (FIG. 3) comprises a plurality of detector cells 12 arranged in rows and columns on a single slab of semiconductor material having a preselected bandgap for detecting infrared energy of a desired wavelength. A practical detector matrix is a 32×32 cell matrix. Nevertheless, any desired number can be used. FIG. 3 shows a 2×2 cell portion of a matrix which is for the description of the invention only.

Figure 1:
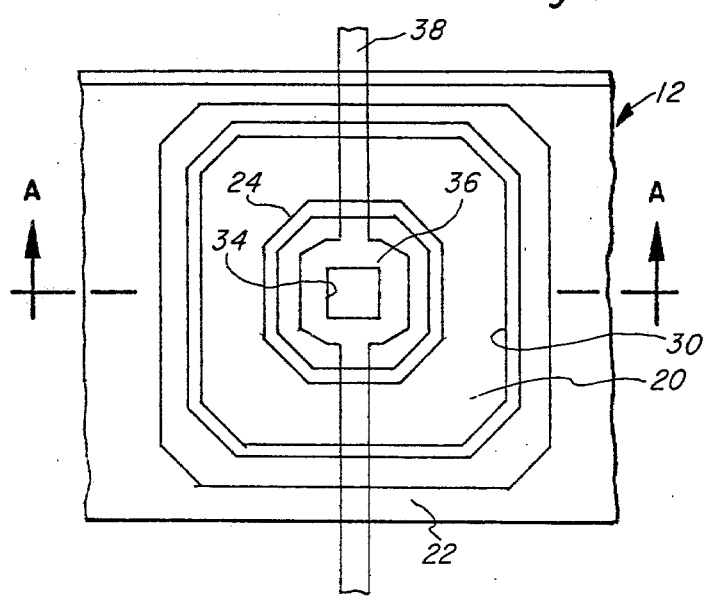
FIG. 1 is a plan view of the detector matrix's cell element of the detecting and imaging system.
Figure 2A:
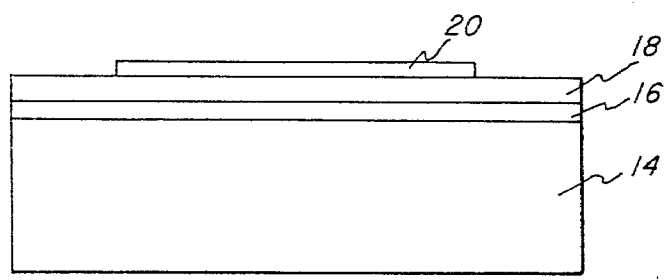
FIGS. 2a-2g are sectional views showing all of the detector matrix incrementally in order to more clearly describe the detector cell construction.
Figure 2B:
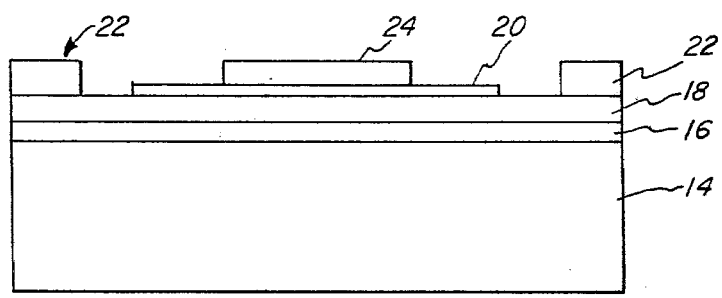
Figure 2C:
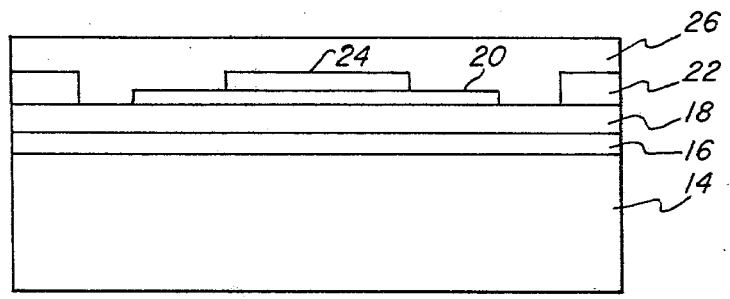
Figure 2D:
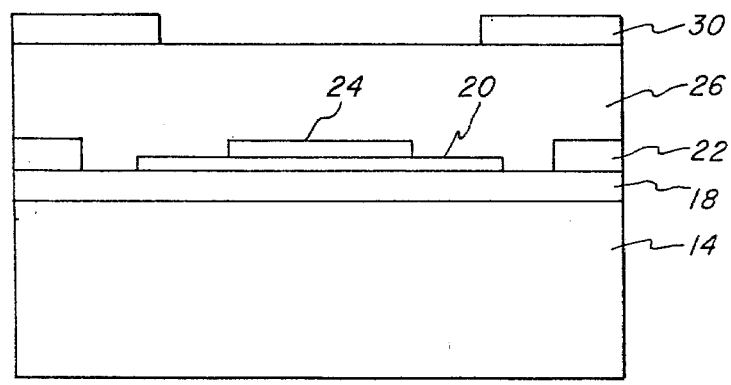
Figure 2E:
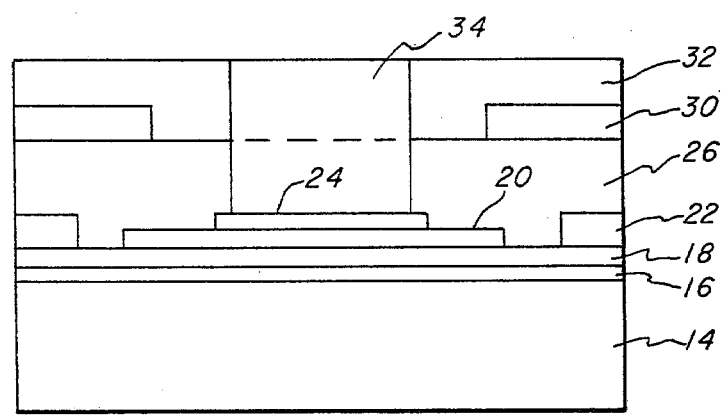
Figure 2F:
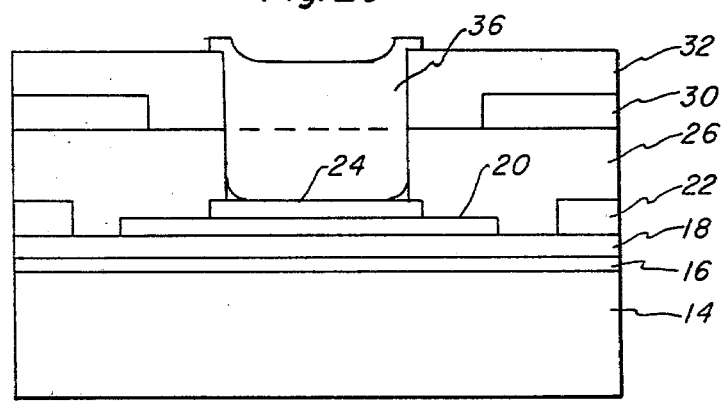

A slab of semiconductor material 14 (FIG. 2a) which may be, for example, a silicon slab for light energy having a visible wavelength to about 1.1 μm or a mercury/cadmium/telluride (HgCdTe) slab for wavelengths of either about 3-5 μm or 8-14 microns. The conductivity type of the semiconductor material may be either "p" or "n" type. For purposes of description of HgCdTe slab of "n" type conductivity is used.

Each cell 12 (FIGS. 1 and 2a-2g) comprises the substrate 14 (FIG. 2a) of HgCdTe material of "n" type conductivity.

The upper surface of substrate 14 has a native oxide layer formed to a thickeness of about 500 Å–700 Å. A first insulating layer 18 of, for example, ZnS having a thickness of about 200 A to about 1500 A covers the native oxide layer 16. The ZnS layer is formed, for example, by sputtering, which is a well known semiconductor fabrication process. A metal layer 20 selectively covers a portion of the first insulating layer to a thickness of about 150 Å. The metal layer 20 is transparent to infrared energy and is, for example, nickel. The uncovered portion of metal layer 20 defines the integrate well or IR sensitive area of the cell. This metalization together with the subsequent metalizations to be described are made using, for example, the well known photolithographic lift semiconductor metalization process.

A thick metal 24, (FIG. 2b) which is opaque to infrared energy, selectively covers portions of the insulating layer 18 and transparent metal 20 to form, respectively, a drain or common sink 22 and a column or integrate electrode 24. The opaque metal is, for example, aluminum having a thickness of about 200 Å–1500 Å.

A second insulating layer 26 (FIG. 2c) covers the first level electrodes 22 and 24. The insulating material is, for example, ZnS and the layer has a thickness of about 1000 Å to 3000 Å. An opaque metal electrode (FIG. 2d) forms a transfer gate 30 on the ZnS layer 26. The opaque metal is, for example, aluminum of a thickness of about 1000 Å to 5000 Å.

Figure 2G:
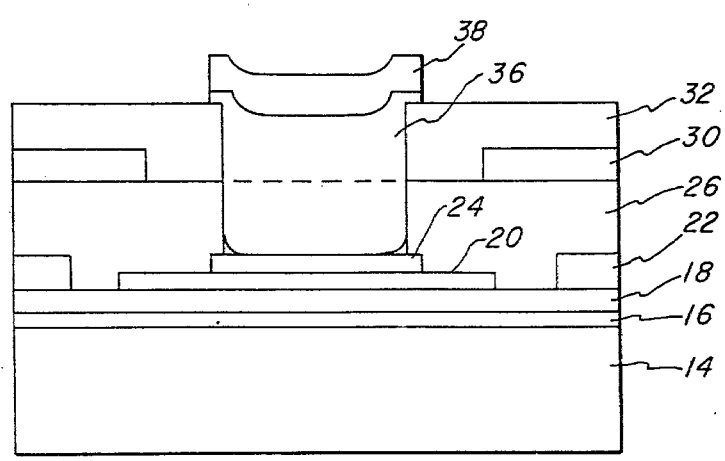

A third insulating layer 32 (FIG. 2e) covers the transfer gate 30. The insulating layer is, for example, ZnS and has a thickness of about 1000 Å to 5000 Å. An aperture 34 (FIG. 2e) provides a passage through insulating layers 32 and 26 to the opaque, thick metal forming the column gate electrode 24. Owing to the thickness of the insulating layers 26 and 32 a thick metal layer is required to cover the edges of the aperture 34. Thus, aperture 34 is filled with, for example, indium 36 (FIG. 2f) and capped with an aluminum column address line 38 (FIG. 2g).

The fabrication techniques of the detector element or cell are well known semiconductor fabrication techniques, and thus are not described in greater detail. Those desiring further information concerning this fabrication technique are referred to U.S. patent application Ser. No. 950,191; filed Oct. 10, 1978, for a "Narrow Band-Gap Semiconductor CCD Imaging Device and Method of Fabrication," R. A. Chapman et al, now U.S. Pat. No. 4,231,149.

To complete an understanding of the detector matrix cell, reference is made to FIG. 3 in which the matrix is shown as a partial broken plan view. The line 40 defines the edge of the transparent metal of the integrate well 20. Line 42 defines the inner edge of drain 22, and line 44 defines the outer edge of drain 22. Drain 22 is continuous throughout the matrix to form a drain common to each detector cell of the matrix. Line 46 defines the edge of the thick metal portion 24 of the column gate electrode. Line 48 defines the inner edge of transfer gate 30 and line 50 defines the outer edge of transfer gate 30. Line 52 defines the indium filled via 34, and line 51 defines the outer edge of the read line 38.

A via 54 connects the common drain 22 to a biasing circuit 53 of electrical power illustrated in FIG. 3. The biasing source power is selectively turned on and off by a time controlled switching circuit (not shown). The bias is to eliminate the collection of surface charge in the drain from interfering with the charge collection capacity of the cells and to form potential wells. Each column of integrate wells 24 is connected by the address bus or line 38 to lead bond pads 56. Lead bond pads 56 are at the ends of the columns with the bond pads at every other column being on the same end of the columns. Lead bond pads 56 connect the cells or detector elements of each column to a buffer and clamp, sample and hold circuit for a purpose hereinafter described in connection with the operation of the imager. A buffer, clamp, sample and hold circuit 57a, 57b is provided for each column. A column multiplexer 59 (FIG. 3) processes the output of the clamp-sample-and-hold circuits 57a, 57b to provide a serial video output. The transfer gates 30 are connected through vias 58 to a row multiplexer 55 for addressing the rows of detector cells 12 in any sequence. The via connections to the transfer gate rows can be alternated on the left and right hand sides of the array shown in FIG. 3.

In another embodiment the drain 22 is replaced by a diode operative to remove the charges dumped from the integrate wells by the transfer gates 30. The diode is formed by forming a region of a conductivity type opposite to that of the slab of semiconductor material in the slab of semiconductor material to form a p-n junction. In our example, the semiconductor slab was of n-type conductivity; thus the region is of p-type conductivity. The p-type region is adjacent to the active area of the transfer gate. The p-type region is in contact with the drain metalization which acts as a bias lead connected to the negative terminal of a biasing source of power whose positive terminal is grounded to the slab of semiconductor material to complete the circuit. As the sole function of the diode is to remove the charges, it may be common to all the cells.

The operation of the imager may be varied (FIGS. 4a–4e). In one operation mode, at time $t_0$, the column gate electrodes 24, transfer gates 30, and drain electrodes 22 are all turned on (FIG. 4a), however, the voltages are such that the wells capacities 60, 62, and 64 are staggered. At time $t_1$, a row of cells is addressed by a multiplexer turning the transfer gates 30 off for that row. During the time $t_1-t_2$ charges are integrated into the column wells 60 of (FIG. 4b) the selected row. At time $t_2$, clamp, sample and hold circuits are actuated to clamp onto the voltage levels at the column wells, and the transfer gates 30 are turned on. With the transfer gates 30 on (FIG. 4c) the charges are dumped into the drain wells 62. At time $t_3$, the transfer gates 30 are turned off (FIG. 4d), and the voltages on the column lines are sampled by the clamp, sample and hold circuits. The voltage difference ($\Delta V$) signals are representative of the intensity of the infrared energy impinging on the row of cells. At time $t_4$, while the transfer gates 30 are still off (FIG. 4e), injection pulses are applied to the drain electrodes to clear the drain wells. At time $t_5$, the gate electrodes 22, 24, and 30 are all turned on to restore the matrix to its initial stage and the cycle repeated for each successive row.

In another embodiment, the drain 22 is a diode. The diode structure eliminates the need for an integration pulse to clear the sink of its charge. Also with a diode acting as the drain, the column electrodes could be biased to produce deeper wells; this is because the drains will not have to store charges. Otherwise, the mode of operation remains the same as the first mode of operation.

Figure 4A:
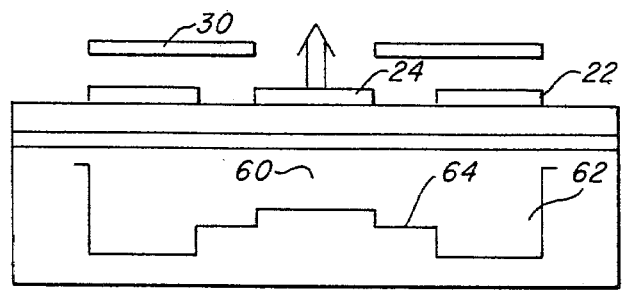
FIGS. 4a-4e are cross-sectional views depicting by steps a mode of operating the detector matrix.
Figure 4B:
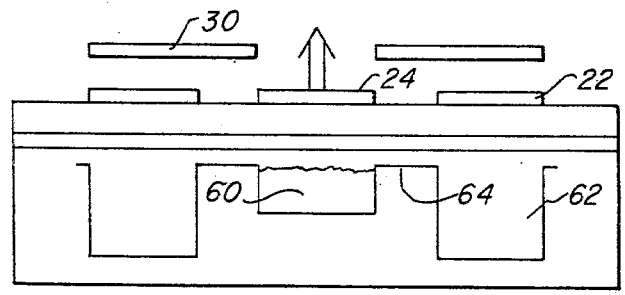
Figure 4C:
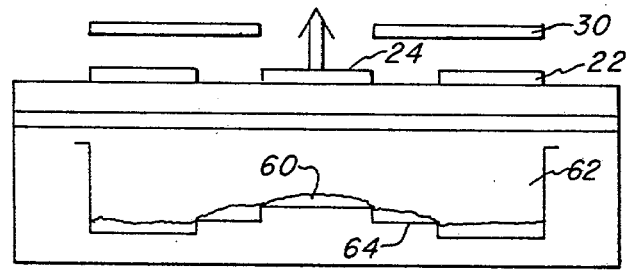
Figure 4D:
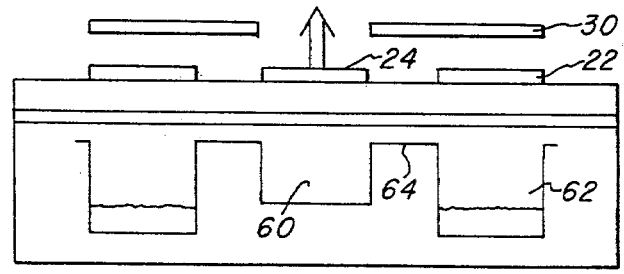
Figure 4E:
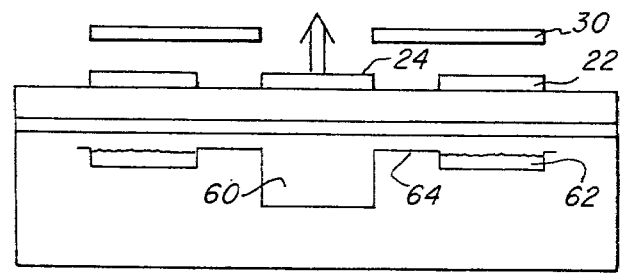

In a third mode of operation, the starting condition, $t_0$, has the electrode 30 off, 22 and 24 on and all column wells full and the sink or drain well 22 empty. At time $t_1$ a row is addressed by turning the transfer gate 30 on which drains out the initial charge. At time $t_2$ the transfer gate 30 is turned off and the integration cycle for that row is begun (FIG. 4b). At $t_3$ the voltage on the column electrode 24 is clamped by clamp, sample and hold circuit, and the transfer gate is turned on (FIG. 4c). With the transfer gate turned on, the charge is dumped into the drain wells 62. At time $t_4$ the transfer gate (FIG. 4d) is turned off and the voltage on the column electrode sampled by the sample and hold circuit. The voltage difference ($\Delta V$) signal of the clamp, sample and hold signal represents the intensity of the impinging infrared energy. This third mode of operation has the advantage over the first mode of operation in that the sink filling by optically generated charge in the unaddressed cells is kept to a minimum. However, it does load the well read line with capacitance which lowers the sensitivity of the cell to charge. Thus, operation mode 3 is only useful if optically generated charge or dark current generated charge or both fill the drain too quickly in mode 1 operation. In other words, one then trades off charge sensitivity for more charge to detect.

The operation of the device has been described in conjunction with buffer, clamp, sample and hold circuits, multiplexer, and timing circuits. These circuits are circuits well known to those skilled in the art and therefore are not described in greater detail. Those desiring additional information are referred to U.S. patent application Ser. No. 141,498 (TI-7803) for "An Infrared Matrix Using Transfer Gates."

Although several embodiments of this invention have been described herein, it will be apparent to a person skilled in the art that various modifications to the details of construction shown and described may be made without departing from the scope of this invention.

What is claimed is:

1. An infrared imaging system including an optical means for focusing infrared energy emanating from a scene comprising:
   (a) an MIS detector matrix for receiving the focused infrared energy in the field-of-view of the optical means and converting such energy into electrical signals representative of the impinging infrared energy, said detector matrix including a plurality of detecting cells formed on the infrared sensing semiconductor material, each cell having an integrate well formed by an MIS electrode for collecting charges generated by the impinging infrared energy, a transfer MIS gate for selectively transferring the charge from the integrate well, and drain means common to selected cells to drain the charge out of the integrate wells responsive to said transfer gate; and
   (b) means connected to the integrate wells for measuring voltage difference of the integrate wells with and without the charges and processing video signals representative of the voltage differences.

2. An infrared imaging system according to claim 1 wherein each of said cells includes an integrate MIS electrode on the slab of infrared sensing semiconductor material, said electrode having portions transparent to infrared energy for forming preselected light sensitive areas in said slab of semiconductor material and opaque conductor portions electrically connected to the transparent portions of said electrodes.

3. An infrared imaging system according to claim 2 wherein each said cell further includes a via electrically connecting the opaque portions of the transparent integrate MIS electrode to a column line.

4. An infrared imaging system according to claim 3 wherein the vias contain metal which is of a thickness sufficient to ensure continuity through the via.

5. An infrared imaging system according to claim 4 wherein the metal contained in the via is indium.

6. An infrared imaging system according to claim 1 wherein said transfer gate electrodes are connected in rows.

7. An infrared imaging system according to claim 1 wherein the common drain means surrounds each integrate MIS electrode of the plurality of cells in a spaced relationship thereto.

8. An infrared imaging system according to claim 6 wherein the common drain means and integrate MIS electrode are formed from a first level MIS metalization on the slab of semiconductor material.

9. An infrared imaging system according to claim 8 wherein the common drain is connected to a biasing circuit which periodically collapses the MIS potential well of the drain and injects the charge in the drain well into the substrate.

10. An infrared imaging system according to claim 6 wherein said transfer gate covers in a spaced relationship the space between the integrate electrode and the common drain means thereby forming a second level MIS electrode on the slab of semiconductor material.

11. An infrared imaging system according to claim 1 wherein the common drain means comprises a junction diode.

12. An infrared imaging system according to claim 11 wheren the junction diode common drain is connected to a biasing circuit which removes from the drain the charge transferred from the integrate wells.

* * * * *